(12) United States Patent
Malik, Jr.

(10) Patent No.: US 8,784,586 B2
(45) Date of Patent: Jul. 22, 2014

(54) TAPE APPLICATOR

(75) Inventor: Richard S. Malik, Jr., Rossford, OH (US)

(73) Assignee: First Solar, Inc., Perrysburg, OH (US)

(*) Notice: Subject to any disclaimer, the term of this patent is extended or adjusted under 35 U.S.C. 154(b) by 397 days.

(21) Appl. No.: 13/213,269

(22) Filed: Aug. 19, 2011

(65) Prior Publication Data

US 2012/0043007 A1 Feb. 23, 2012

Related U.S. Application Data

(60) Provisional application No. 61/375,733, filed on Aug. 20, 2010.

(51) Int. Cl.
*B32B 41/00* (2006.01)
*B32B 37/10* (2006.01)
*B32B 38/18* (2006.01)

(52) U.S. Cl.
USPC ............ 156/64; 156/285; 156/297; 156/298; 156/299; 156/300

(58) Field of Classification Search
CPC ...... B32B 7/00; B32B 37/10; B32B 37/1009; B32B 37/12; B32B 38/18; B32B 41/003; B65C 9/28
USPC ........... 156/64, 285, 297, 298, 299, 300, 497; 136/256
See application file for complete search history.

(56) References Cited

U.S. PATENT DOCUMENTS

| | | |
|---|---|---|
| 2,658,098 A | 11/1953 | Coleman et al. |
| 3,062,464 A | 11/1962 | Moose et al. |
| 3,362,863 A | 1/1968 | Larsson et al. |
| 3,586,587 A | 6/1971 | Boyce |
| 4,026,757 A | 5/1977 | Crawford |
| 4,234,374 A | 11/1980 | Frank |
| 4,460,804 A | 7/1984 | Svejkovsky |
| 4,552,611 A | 11/1985 | Dery et al. |
| 4,627,886 A | 12/1986 | Grone et al. |
| 4,853,074 A | 8/1989 | Manusch et al. |
| 5,580,413 A | 12/1996 | Assink et al. |
| 5,700,347 A | 12/1997 | McCowin |
| 5,846,621 A | 12/1998 | Nagamatsu |
| 2002/0057300 A1 | 5/2002 | Baker |
| 2003/0056905 A1 | 3/2003 | Kuhn et al. |
| 2005/0109389 A1 | 5/2005 | Middelman et al. |
| 2005/0244650 A1 | 11/2005 | Ren et al. |
| 2006/0081321 A1 | 4/2006 | Bradshaw et al. |
| 2007/0196588 A1 | 8/2007 | Shinjo et al. |
| 2009/0072071 A1 | 3/2009 | Lucht |
| 2009/0320997 A1 | 12/2009 | Herz et al. |
| 2010/0307568 A1 * | 12/2010 | Cheng et al. .................. 136/251 |

FOREIGN PATENT DOCUMENTS

JP 2006-28578 A 2/2006
WO WO 2010/044234 A1 4/2010

* cited by examiner

*Primary Examiner* — George Koch
(74) *Attorney, Agent, or Firm* — Dickstein Shapiro LLP

(57) ABSTRACT

A method of applying a strip of tape includes directing air pressure at a raised section of a conductor.

12 Claims, 10 Drawing Sheets

TAPE APPLICATOR

RELATED APPLICATIONS

This application claims priority under 35 U.S.C. §119(e) to Provisional Application No. 61/375,733, filed on Aug. 20, 2010, which is hereby incorporated by reference in its entirety.

TECHNICAL FIELD

The present invention relates to photovoltaic modules and methods of manufacturing same.

BACKGROUND

A connection assembly may be electrically connected to a contact region of a photovoltaic module, to facilitate connection between the photovoltaic module and other electrical components, including, for example, one or more additional photovoltaic modules. One or more adhesive or conductive strips of tape may be used to connect or secure one or more components of the connection assembly to the photovoltaic module. Current tools and methods for applying these strips of tape are inefficient.

DETAILED DESCRIPTION

Photovoltaic modules can include multiple layers (or coating) created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface.

A photovoltaic module may include a connection assembly for electrically connecting one or more electrical components to the module, including, for example, one or more additional photovoltaic modules. The assembly may contain various suitable components, including, for example, one or more bussing components or assemblies. For example, one or more conductors may be applied adjacent to a contact layer of a photovoltaic module. The conductors may include any suitable material, including, for example, one or more strips of conductive tape (e.g., lead foils). The conductive tape may consist of any suitable conductive material, including, for example, tin-plated copper. A common or main conductor may be applied adjacent to the one or more conductors. For example, one or more bus bars may be applied adjacent to one or more strips of conductive tape. One or more strips of adhesive tape (e.g., double-sided tape) may also be incorporated into the connection assembly.

For example, a first adhesive strip of tape may be applied adjacent to a contact region of a photovoltaic module. The first adhesive tape strip may be distributed across the length of the module. A first conductive tape strip may be applied adjacent to (e.g., directly on) the first adhesive tape strip. A second adhesive tape strip may be applied adjacent to (e.g., directly on) the first conductive tape strip and the first adhesive tape strip, and a second conductive tape strip may be applied thereon. The second adhesive tape strip may be positioned approximately 2 to about 50 mm from the starting point of the first adhesive tape strip. The second adhesive tape strip may include an insulator material, and may thus electrically isolate the first and second conductive tape strips. The second adhesive tape strip and second conductive tape strip may be positioned such that at least a portion of the first conductive tape strip is exposed (i.e., not covered by the second adhesive tape strip and second conductive tape strip). The first and second conductive tape strips may be positioned such that they do not physically and/or electrically contact one another. Thus the first and second conductive tape strips may be capable of receiving different charges. The first conductive tape strip may be configured to receive a positive charge, and the second conductive tape strip may be configured to receive a negative charge, or vice versa. The first and second adhesive tape strips may contain an adhesive on both sides. Accordingly, the first and second adhesive tape strips, respectively, may fixedly secure the first and second conductive tape strips to the module. One or more common conductors (e.g., bus bars) may be applied adjacent to the adhesive tape strips and conductive tape strips, to provide a common connection for the module. The adhesive tape strips may also fixedly secure the common conductor to the photovoltaic module. For example, one or more common conductors may be positioned substantially perpendicular to a deposited strip of double-sided tape and/or conductive tape. Each of the common conductors may form an electrical connection with any exposed portions of the conductive tape strips.

The conductive tape strips may be deposited with a looped section, in which a portion of the conductive tape is physically separated from the adhesive tape strip beneath. The purpose of this configuration is to facilitate connection of the conductive tape with other electrical components. This may be accomplished by cutting the conductive tape loop, to form a suspended lead which may be fed into a cord plate or junction box to provide a connection point to the lead. The conductive loops can take on a variety of shapes, and these shapes can have various effects on the manufacturing process. For example, the conductive loop often assumes a substantially curved, crescent, or arc shape due to the residual memory from the conductive tape being wound in a roll. In this scenario, a portion of the conductive tape suspended from the surface may be substantially close to or extend over the base of the loop, making it difficult for a tape dispensing apparatus to lower itself to the base of the loop without physically contacting a portion of the loop. When such contact occurs, it is possible for the loop to actually be folded down by the tape dispensing apparatus, and taped over. This results in the fabrication of modules which have to be fixed or even scrapped. The raised portion of the loop may also be substantially vertical (i.e., straight), but still slanted over the base portion of the loop. In this scenario, the tape dispensing apparatus may still have difficulty lowering itself without physically contacting the loop.

One method of resolving the aforementioned issue is to displace a portion of the loop to create sufficient room for vertically lowering the tape dispensing apparatus proximate to the base of the lead foil. This can be achieved by directing air pressure toward the loop to sufficiently displace the loop so that it no longer covers (or hovers over) the base portion of the conductive tape. Any suitable amount of air pressure may be applied. The air pressure may be applied for any suitable duration. For example, the air pressure may be applied for 1 or more seconds, 10 or more seconds, 20 or more seconds, 30 or more seconds, 1 or more minutes, less than 45 seconds, less than 30 seconds, or less than 15 seconds. The duration of the air pressure may be tied closely to the time needed to manufacture certain components of the connection assembly. For example, the air pressure may be output beginning at the point of application of an adhesive tape strip proximate to the base of a conductive tape strip loop, and may end following successful application of that piece of tape. Alternatively, the air pressure may be directed continuously at a designated zone, through which the photovoltaic module (with a conductive tape loop positioned thereon) may pass, for application of a strip of adhesive tape. The designated zone may be configured such that the loop on the module is positioned proximate to the air pressure flow apparatus such that air is directed at the loop to achieve the desired displacement for tape application. The air pressure flow apparatus may be kept at an ON position at all times, or it may be triggered upon the module reaching a certain position, including for example, upon the module arriving at the designated zone.

The air pressure flow apparatus may be part of the tape dispensing apparatus. For example, the tape dispensing apparatus may include an output mechanism for dispersing air pressure. This output mechanism may be connected to an air pressure source. The output mechanism can take any suitable shape or form, including, for example, an nozzle. This output mechanism can be positioned such that upon lowering of the tape dispensing apparatus to the base portion of the lead foil, any portion of the loop hovering over or covering the base portion, may be displaced or deflected. This can be achieved in a variety of ways. For example, the air pressure flow apparatus may be set to an ON position at all times, such that upon entering a certain zone of proximity to the loop, the loop will be sufficiently displaced during lowering, and in the subsequent application. Alternatively, the air pressure flow apparatus may be configured to turn ON upon reaching a certain proximity to the loop. The appropriate proximity may be estimated via a timing sequence programmed into a memory component of a microprocessor. Alternatively, the system may be triggered by the downward motion of the tape dispensing apparatus. Stoppage of air flow may be triggered by the horizontal motion of the tape dispensing apparatus during application of tape. The tape dispensing apparatus may also be equipped with a proximity sensor that effectively alerts the apparatus (or larger system) that a potential obstruction is near and that air flow is necessary to attempt to remove it. In such a scenario, the system may be calibrated to determine if sufficient displacement of the loop has been achieved, or if further air pressure is necessary before further lowering of the tape dispensing apparatus should commence. The tape dispensing apparatus may be configured to cease lowering, and to wait until sufficient displacement of the loop has occurred. This stop or halt mechanism may be useful for reducing the number of scrap modules. It is possible that different loops may require varying amounts of pressure at varying positions, for varying amounts of time. For example, the conductive tape itself may contain an adhesive component, thereby resulting in a density, weight, and thickness different from conventional conductive tape strips. These different characteristics can have a substantial effect on the amount of force required to displace the loop. For example, the loop could have a different shape, and it can be or more less able to withstand a given force. Thus a system with a certain degree of autonomy may be useful.

Any suitable tape dispensing apparatus may be used for application of the tape. According to one embodiment, a tape dispensing apparatus may include one or more rollers. The one or more rollers may be positioned in a dispensing "head," and may be aligned in any suitable configuration. For example, the one or more rollers may be assembled in a configuration that allows tape to be applied substantially parallel to a module surface. The one or more rollers may include any suitable number of rollers, including, for example, more than two rollers, more than three rollers, less than ten rollers, or less than five rollers. For example, the one or more rollers may include three rollers. The one or more rollers may be configured for holding one or more strips of tape, or for feeding one or more strips of tape to a desired location. For example, the one or more rollers may be configured to feed one or more strips of tape to a guide, which can direct and output the tape to a desired surface.

The one or more rollers may be configured to hold tape of any desired design or configuration, and of any desired material, including, for example, any suitable polymer, paper, plastic, cloth, metal, or alloy. The tape may include an adhesive on one or both sides. Any suitable adhesive may be used, including, for example, any suitable organic or plant-based, solvent-type, animal protein-based, or synthetic polymer glue. For example, the adhesive may contain an epoxy resin, epoxy putty, ethylene-vinyl acetate, phenol formaldehyde resin, polyamide, polyester resin, polyethylene, polypropylene, polysulfide, polyurethane, polyvinyl acetate, polyvinyl alcohol, polyvinyl chloride, polyvinyl chloride, polyvinylpyrrolidone, rubber cement, silicone, styrene acrylic copolymer, acrylonitrile, cyanocrylate, or acrylic. The applied tape may itself be a conductor as well. For example, a strip of conductive tape may be applied adjacent to a contact region of a photovoltaic module. The conductive tape can include a conductive component, such as a foil, metal film, inorganic film or organic film, for example, a conductive polymer. In certain embodiments, the conductive tape can be a foil tape. Thus the conductive tape loops discussed herein may actually be part of a first strip of tape, containing both adhesive and conductive components. Thus instead of applying a first strip of adhesive tape, followed by a first strip of conductive tape, just one strip of conductive tape (having an adhesive) may be applied, with a loop formed therein.

The rollers may be configured to feed one or more strips of tape for application to a desired area. The rollers may feed the tape through a guide configured to apply the tape in a precise manner to a designated surface. The rollers may be movably secured on shafts, which may be secured inside the head via any suitable securing means, including, for example, any suitable threaded structure, such as a screw, as well as a knob, clip, or latch. The roller may be secured on the shafts by any suitable means. For example, one or more clips may be positioned along each shaft, proximate to (or touching) opposite ends of each roller. The clips may be of any suitable shape. For example, the clips may have a substantially "C" shape. The shafts may have one or more grooves, into which the clips may fit. The clips may be fixedly or movably secured within the grooves. The rollers and roller shafts may be secured within a designated compartment of the apparatus, including, for example, a "head" portion. The head of the apparatus may include a bracket for supporting the shafts and rollers. The bracket may contain any suitable material, including, for example, any suitable metal or alloy, or any suitable plastic material. For example, the bracket may be constructed substantially of aluminum.

In one aspect, a method of applying a strip of tape can include directing gas toward a raised section of a conductor positioned adjacent to a surface. The conductor comprises a first base section at a first end of the raised section and secured adjacent to the surface, and a second base section at a second end of the raised section and secured adjacent to the surface. The raised section intersects a vertical plane extending perpendicular from the first base section. The method can include displacing the raised section so that the raised section no longer intersects the vertical plane. The method can include applying a strip of tape, starting at the first base section.

Directing gas can include directing a burst of gas toward a loop of a conductive tape strip adjacent to a contact region of a photovoltaic module. The gas can include air. The gas can include compressed air. The method can include detecting the raised section and initiating gas flow upon detection of the raised section. The method can include adjusting the directed gas. The method can include stopping the directed gas. The method can include initiating gas flow. The method can include adjusting gas flow. The method can include lowering a tape dispensing apparatus proximate to the surface. The method can include detecting the raised section and stopping lowering of the tape dispensing apparatus. Directing gas can occur while the tape dispensing apparatus is in a stopped position.

In another aspect, a system for dispensing tape can include a tape source configured to apply a section of tape to a taping position on a substrate adjacent to a conductor and a gas source configured to apply a gas stream to a raised section of the conductor to allow the tape source to apply the tape to the taping position. The tape dispensing system can include a first valve in fluid communication with the gas source, configured to start and stop the gas stream. The tape dispensing system can include a controller in connection with the gas source and the first valve. The first valve can include a solenoid valve. The solenoid valve can include a two-position valve.

The controller can be configured to output an OPEN signal to the first valve, and the first valve can be configured to start a flow of gas from the gas source upon receiving the OPEN signal. The controller can be configured to output an OFF signal to the first valve, and the first valve can be configured to stop a flow gas from the gas source upon receiving the OFF signal. The system can include a gas pressure regulator in fluid communication with the gas source and the first valve, and electrically connected to the controller. The controller can be configured to output a HIGH signal to the gas pressure regulator. The gas pressure regulator can be configured to raise the pressure of a burst of gas received from the gas pressure source upon receiving the HIGH signal. The controller can be configured to output a LOW signal to the gas pressure regulator. The gas pressure regulator can be configured to lower the pressure of a burst of gas received from the gas pressure source upon receiving the LOW signal. The controller can be configured to output a change pressure signal to the gas pressure regulator. The gas pressure regulator can be configured to adjust the pressure of gas received from the gas pressure source upon receiving the change pressure signal.

The system can include a second valve in fluid communication with the first valve. The second valve can be configured to adjust gas flow. The tape source can include a tape dispenser, which can include a one or more rollers for dispensing a strip of tape. The system can include a gas output nozzle in fluid communication with the first valve configured to direct gas pressure to a raised section of a conductor positioned adjacent to a surface. The surface can include a contact region of a photovoltaic module. The system can include a sensor in communication with the controller and configured to detect the raised section and to output a signal to the controller or the valve upon detecting the raised section. The gas source can include an air source. The gas source can include a gas cylinder. The gas source can include a compressor.

Figure 1A:
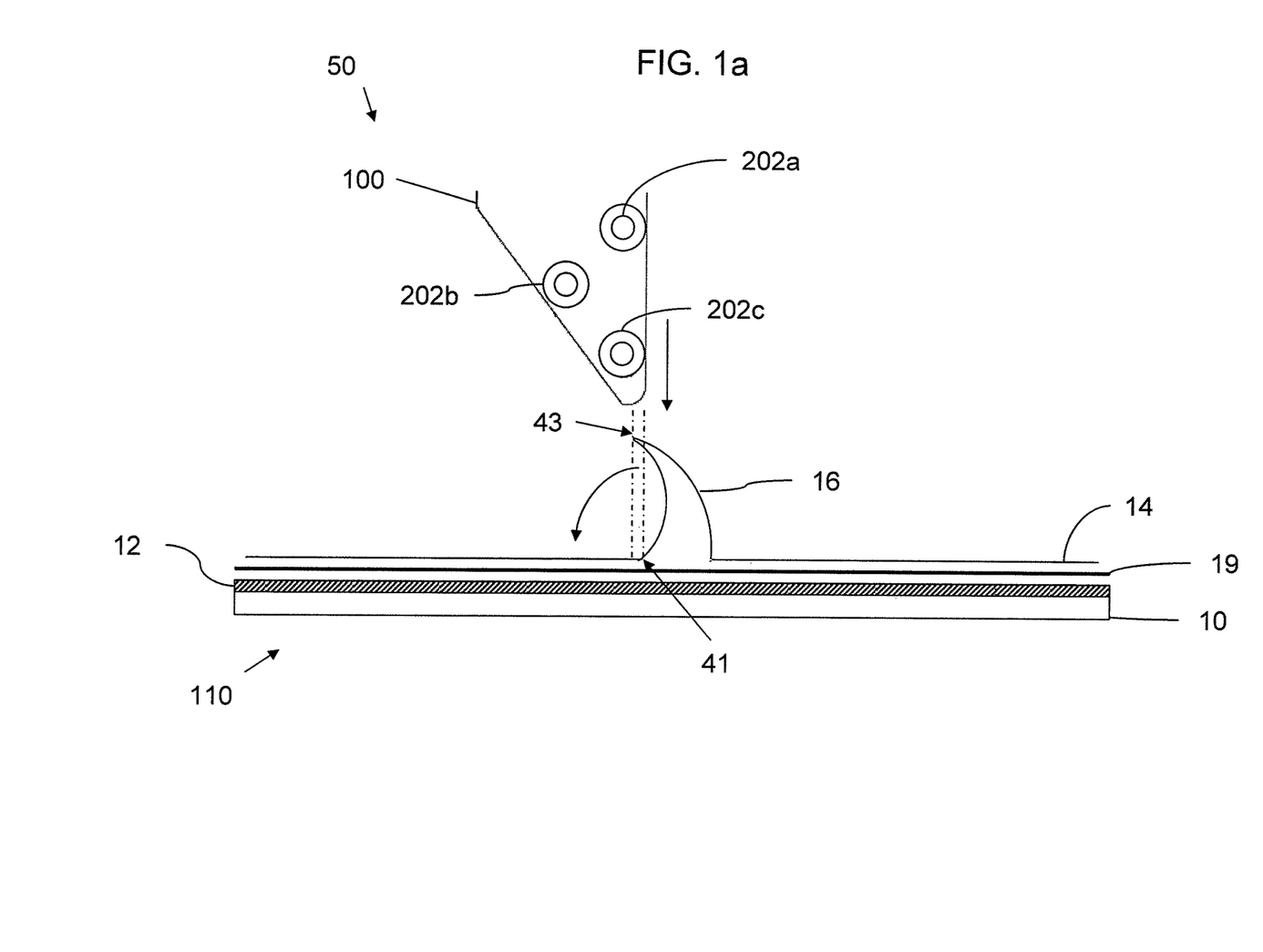
FIGS. 1a and 1b are schematics of a tape dispensing apparatus positioned above a strip of conductive tape having a loop.

Referring to FIG. 1a, a connection assembly may be applied adjacent to or directly on a photovoltaic module 110 including a glass 10. Photovoltaic module 110 may include one or more layers of coating 12 formed on or adjacent to glass 10. Coating 12 may include one or more semiconductor layers (e.g., cadmium telluride or a layer of cadmium, indium, gallium, and selenium), and a back contact layer. A connection assembly may be applied adjacent to the back contact layer, which may include any suitable contact material, including, for example, molybdenum. The connection assembly may include any of a variety of components, including, for example, a first adhesive tape strip 19 positioned on coating 12, which may include a back contact material (e.g., molybdenum). A first conductive tape strip 14 may be applied directly on first adhesive tape strip 19. First conductive tape strip 14 may be applied in such a manner as to form a loop 16, in which at least a portion of first conductive tape strip 14 does not contact any surface. Loop 16 may consist of any suitable shape, including, for example, a substantially curved, crescent, or arc shape as a result of the residual material memory from first conductive tape strip 14 being wound on a roll. Alternatively, referring to FIG. 1b, loop 16 may be substantially straight. The height of loop 16 relative to the module surface may be more than about 10 mm, more than about 20 mm, less than about 40 mm, or less than about 30 mm. For example, loop 16 may have a height of about 24 mm to about 26 mm.

Figure 1B:
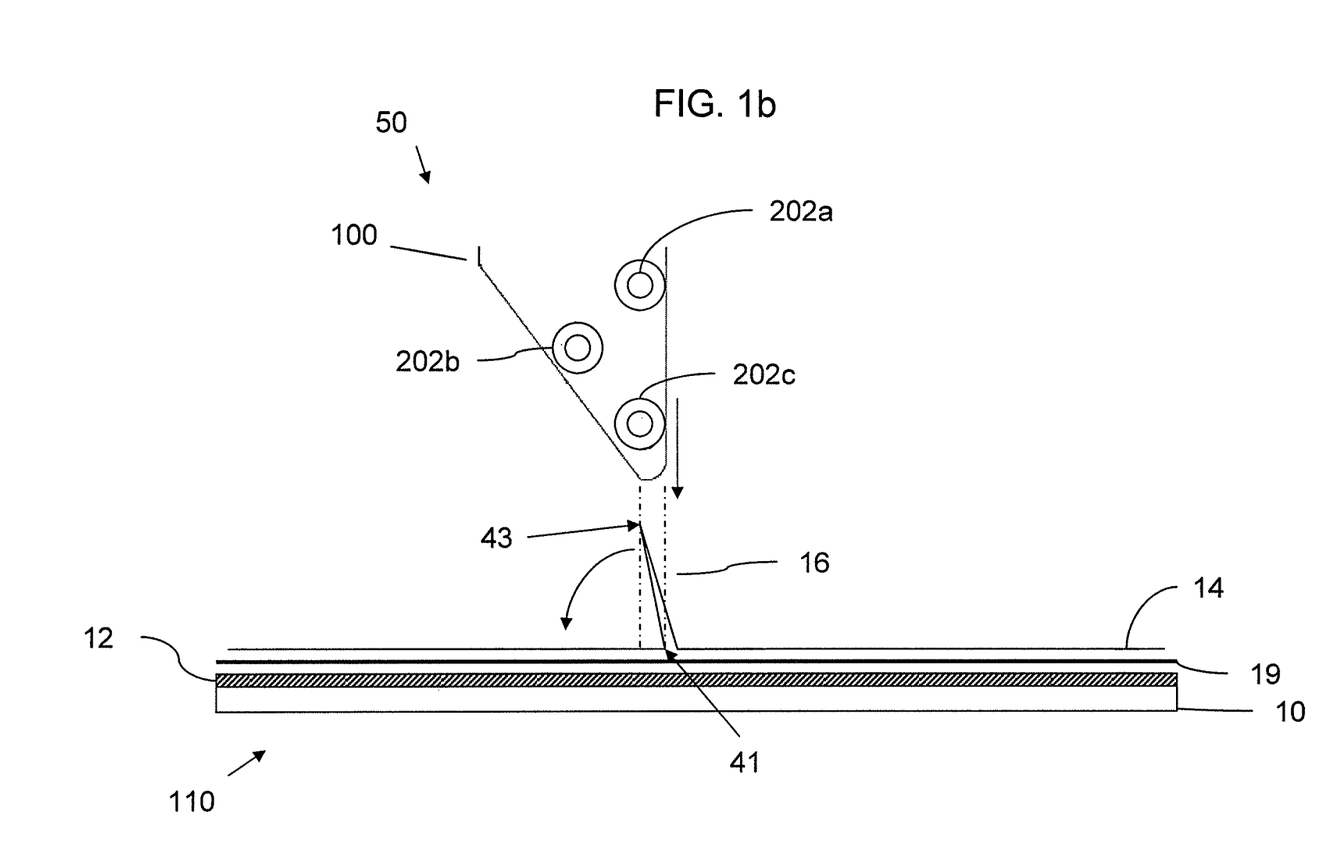
Figure 2A:
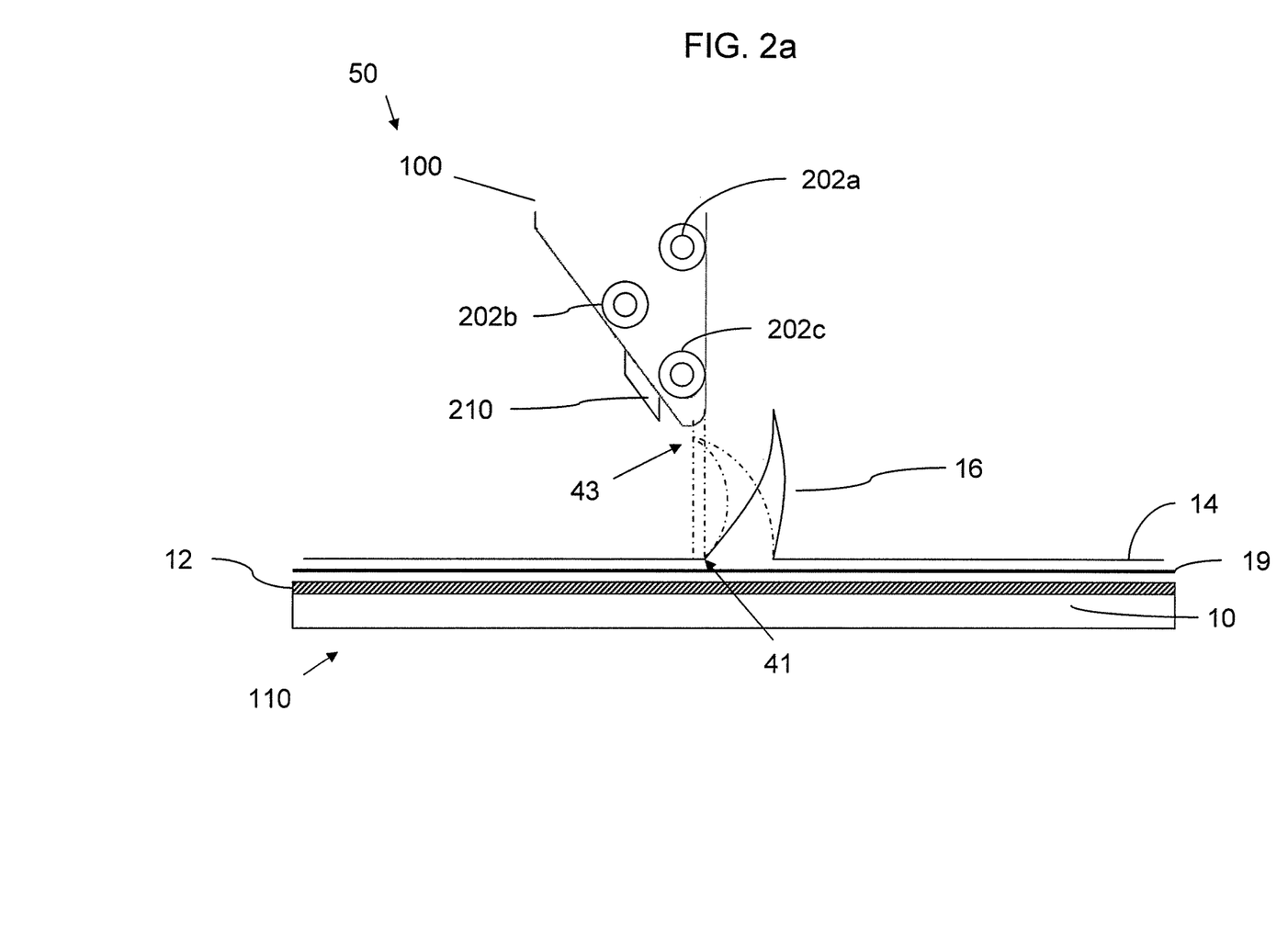
FIGS. 2a-2c are schematics of a tape dispensing apparatus having an output nozzle configured to output a burst of air.
Figure 2B:
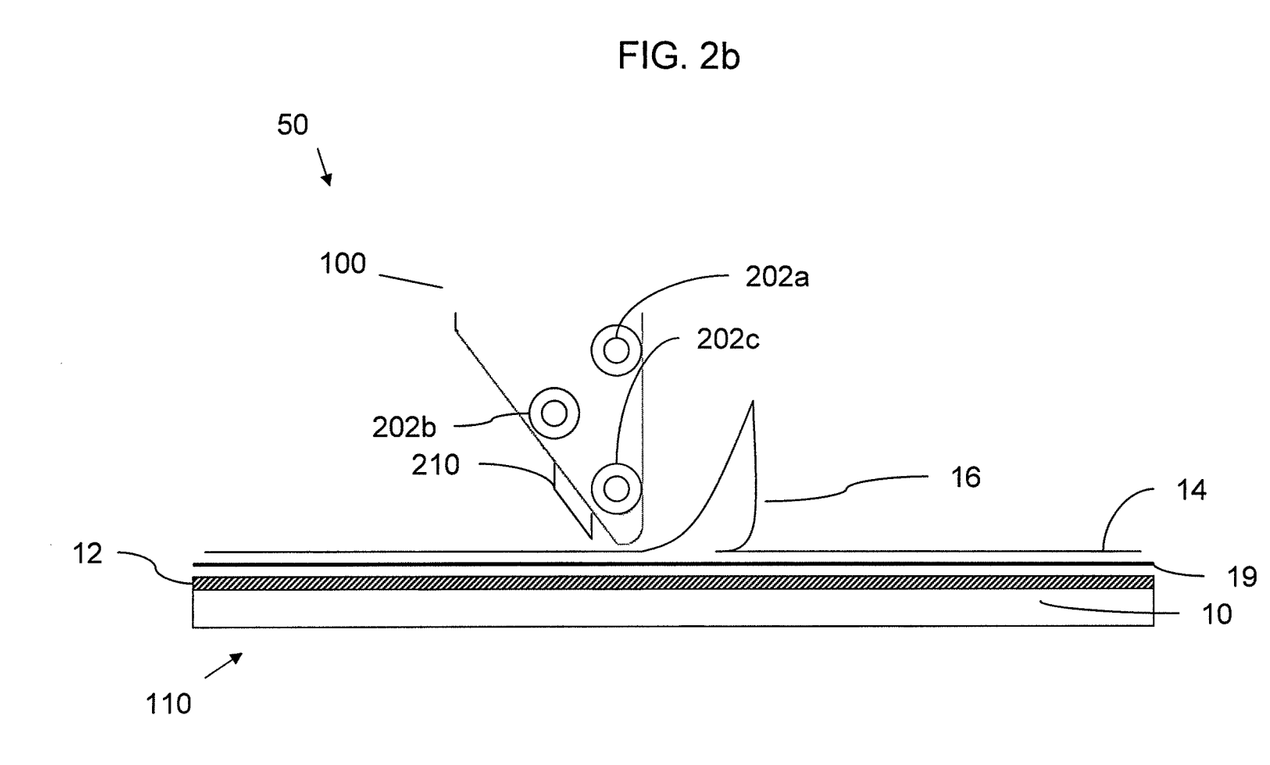
Figure 2C:
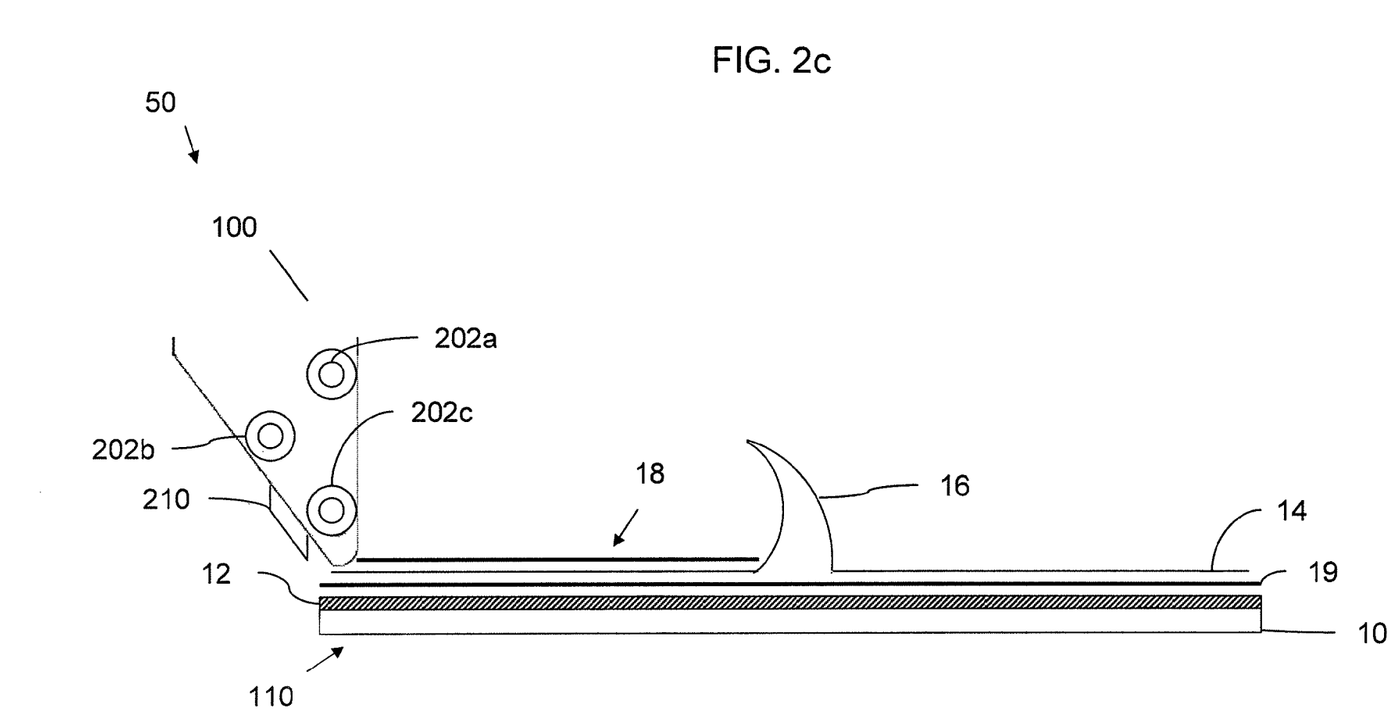
Figure 3A:
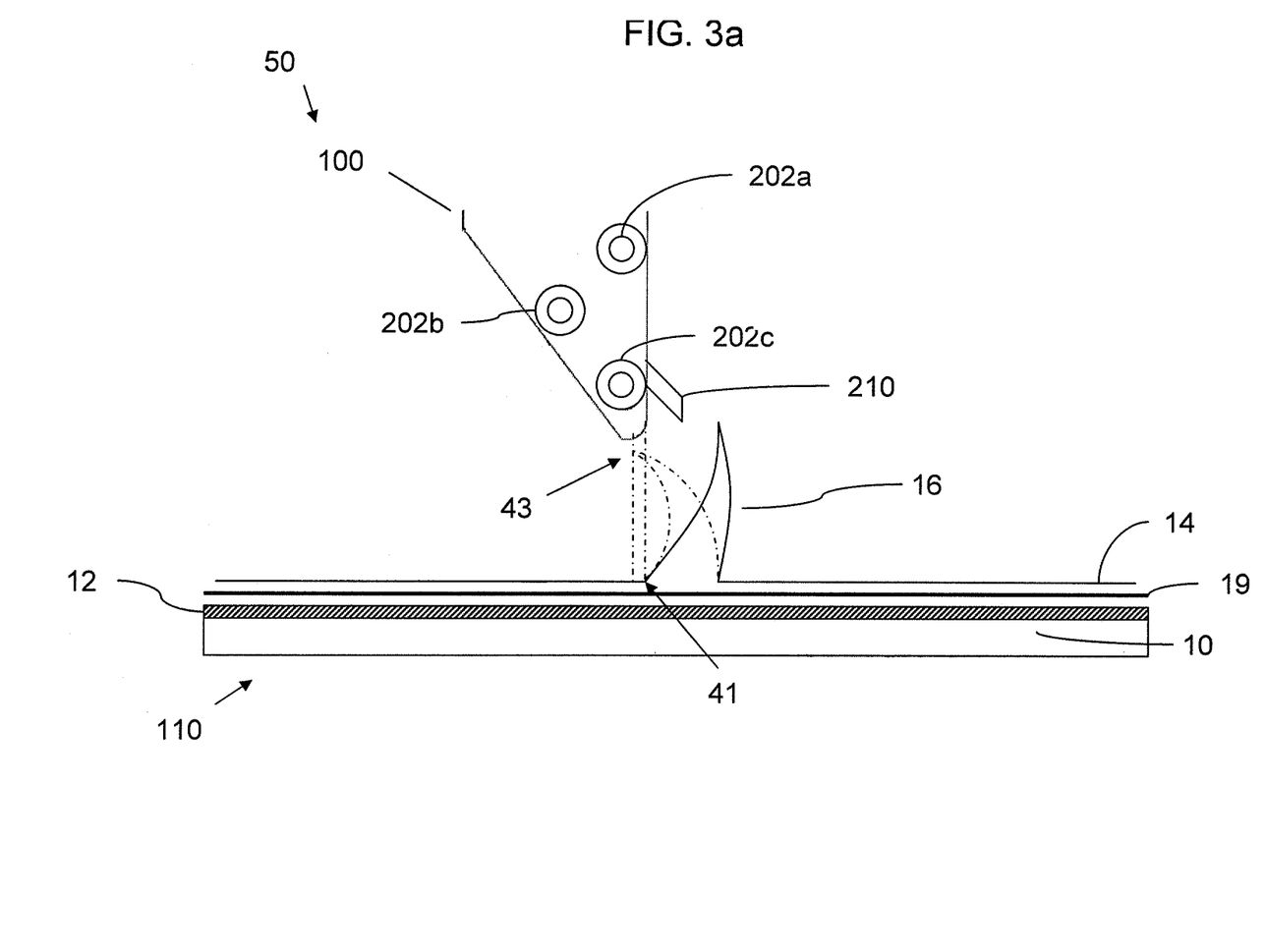
FIGS. 3a-3c are schematics of a tape dispensing apparatus having an output nozzle configured to output a burst of air.
Figure 3B:
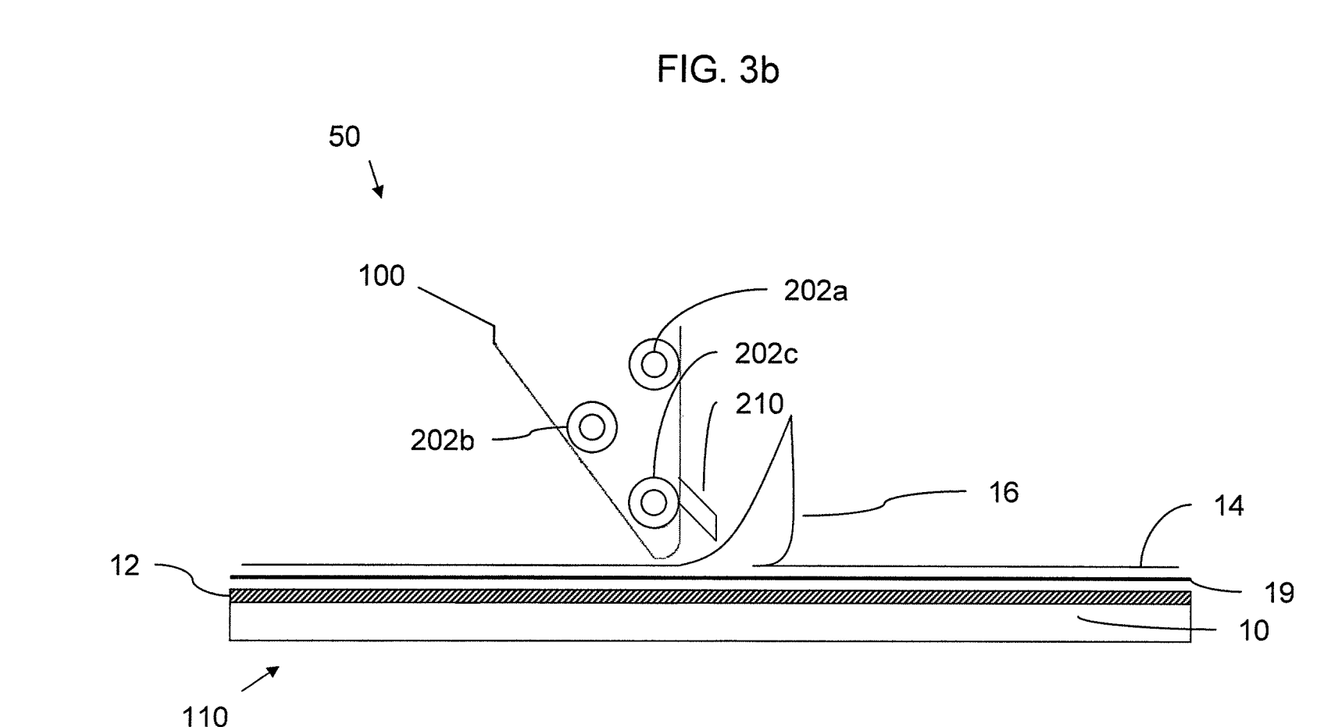
Figure 3C:
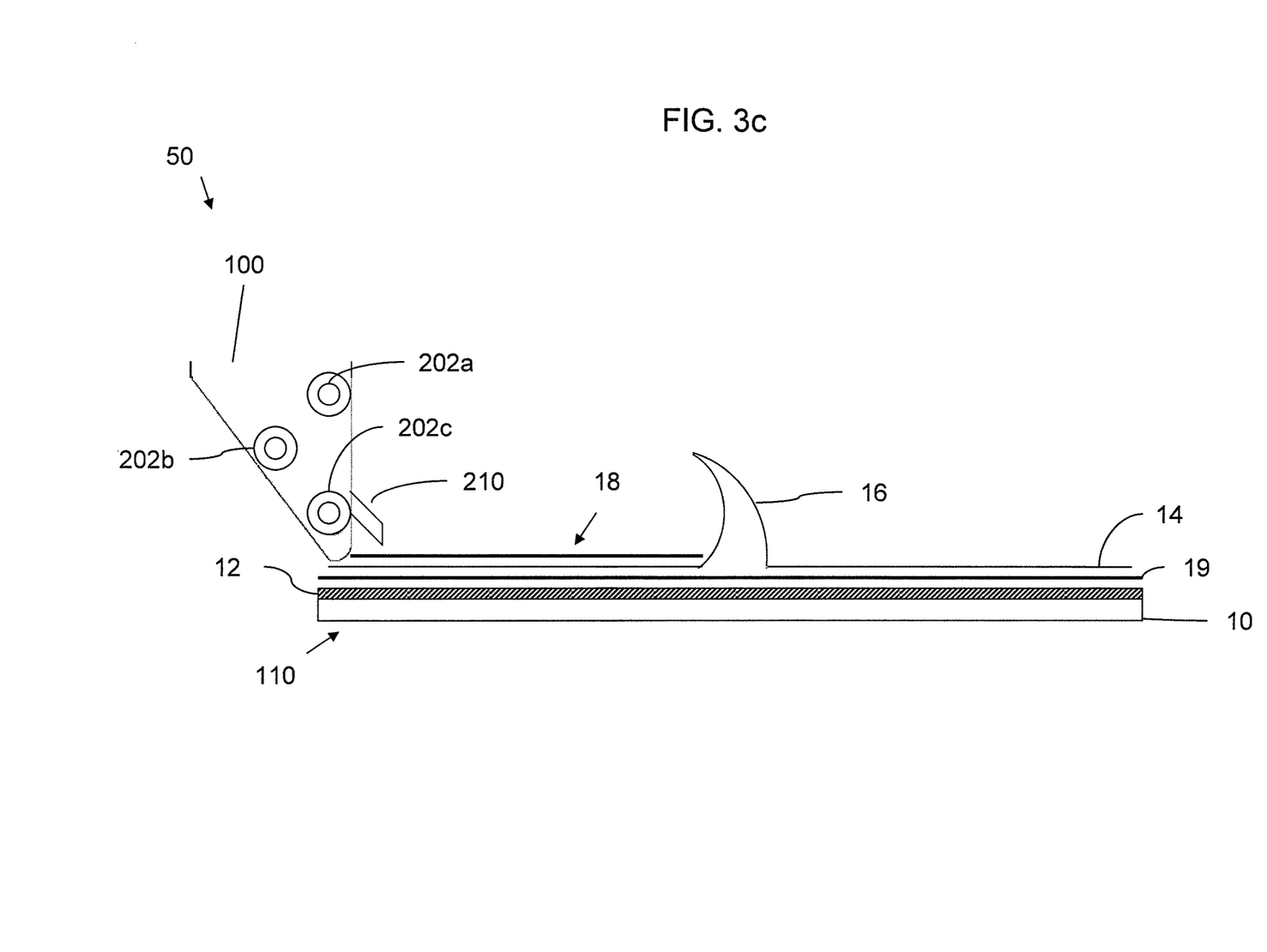
Figure 4:
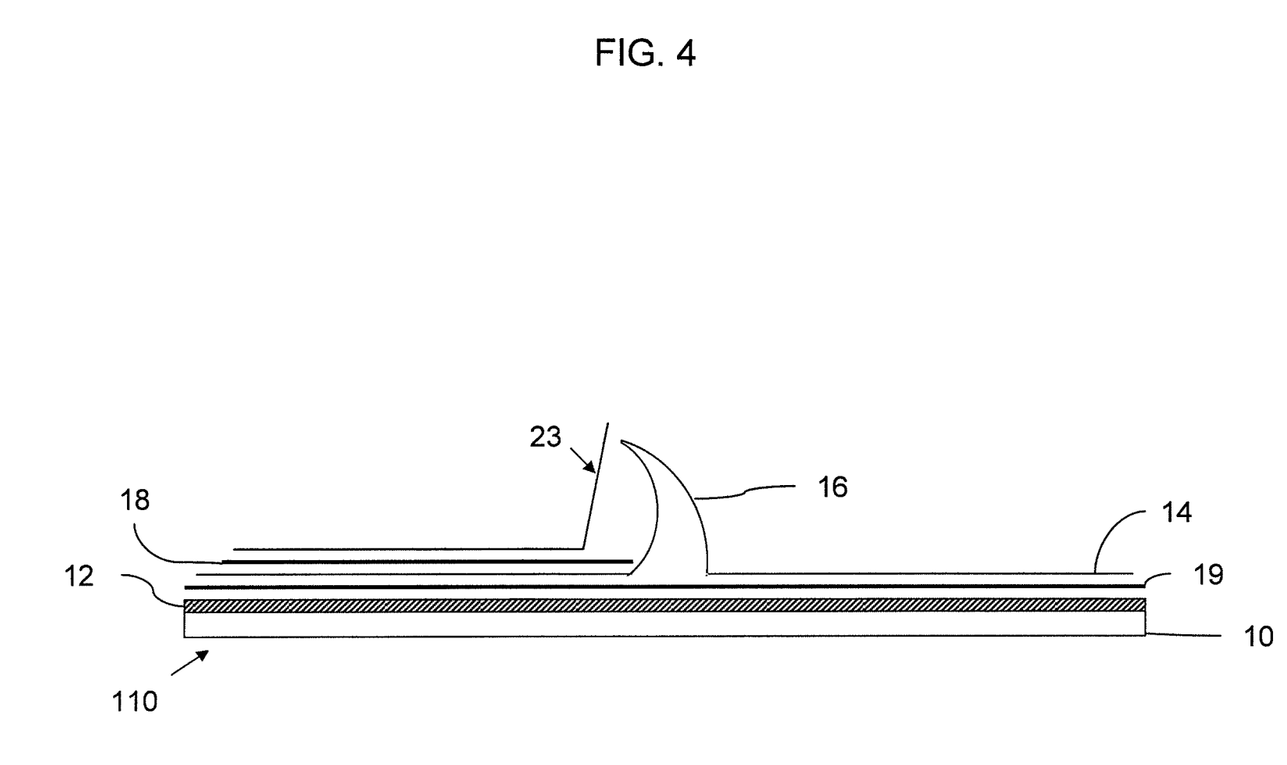
FIG. 4 is a schematic of a connection assembly including multiple conductive components.

First conductive tape strip 14 may have any suitable width, including, for example, more than about 5 mm, more than about 15 mm, more than about 25 mm, less than about 30 mm, less than about 20 mm, or less than about 10 mm. For example, first conductive tape strip 14 may have a width of about 12 to about 13 mm. First conductive tape strip 14 can include a conductive component, such as a foil, metal film, inorganic film or organic film, for example, a conductive polymer. Following application of conductive tape strip 14, a second adhesive tape strip may be applied starting at the base of loop 16. FIGS. 1a and 1b show a tape dispenser 100 being lowered to the surface of photovoltaic module 110. As depicted in FIG. 1a, the curved, crescent, or arc shape of loop 16 makes lowering of dispenser 100 difficult without contacting at least a portion of loop 16. Similarly, with respect to FIG. 1b, despite the straightness of loop 16, it protrudes into the vertical path of tape dispenser 100. FIGS. 1a and 1b show that the top 43 of loop 16 extends past the vertical plane 41 along which the edge of tape dispenser 100 is lowered. FIGS. 2a-2c and 3a-3c depict a system 50 for applying tape. System 50 may include a tape dispenser 100 with an nozzle 210. Nozzle 210 may be positioned on any suitable location of tape dispenser 210. FIGS. 2a-2c depict nozzle 210 on the underbelly of tape dispenser 100, while FIGS. 3a-3c depict nozzle 210 on the front of tape dispenser 100. It should be appreciated that nozzle 210 is not necessarily connected to or a part of the tape dispenser. For example, nozzle 210 may be part of a gas source (such as system or apparatus capable of supplying pressurized air) and can be separate from tape dispenser 100. Nozzle 210 may include any suitable means for outputting a burst of gas such as air, including, for example, any commercially available nozzle (e.g., a Silvent 921 nozzle). Nozzle 210 may have any suitable shape, including, for example, a substantially flat shape, circular, or rectangular shape. A gas source 316 (depicted in FIG. 5) may be configured to output a puff or burst of air, via nozzle 210, at loop 16 to cause sufficient displacement or deflection of loop 16 to allow tape dispenser 100 to be lowered cleanly to apply a second adhesive tape strip adjacent to lead foil 14. FIGS. 2a and 3a depict the displacement of loop 16. As shown, the tip of the conductor crescent or arc is blown back (i.e., deflected away) from tape dispenser 100, thereby providing space for tape dispenser 100 to be lowered substantially close to the edge or base of loop 16. FIGS. 2b and 3b show tape dispenser 100 after it has been lowered. Gas source 316 may be configured to continue blowing air, via nozzle 210, to ensure that tape dispenser 100 does not contact loop 16 when tape dispenser 100 is substantially close to, or in contact with, the surface of lead foil 14. FIGS. 2c and 3c depict photovoltaic module 110 following application of second conductive tape strip 18, whose length begins substantially close to the base of loop 16. The shape of loop 16 is also left substantially intact to its original shape from FIG. 1. FIG. 4 depicts photovoltaic module 110 following application of a second conductive tape strip 23 on second adhesive tape strip 18.

Figure 5:
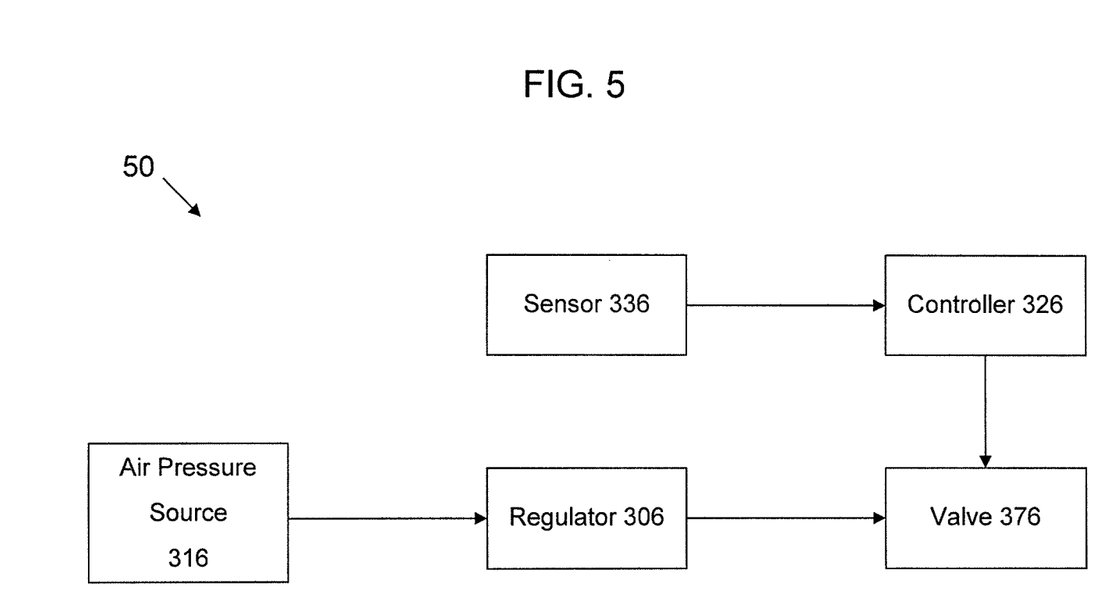
FIG. 5 is a block diagram representing the operation of a tape dispensing system having an output nozzle.

FIG. 5 depicts components that can be included in system 50, which includes gas source 316. Gas source 316 may include any suitable pressure source, including, for example, a fan or a blower. Gas source 316 may be configured to output any suitable gas, including, for example, air from the surrounding manufacturing environment. Gas source 316 may be connected to a gas pressure regulator 306. Gas pressure regulator 306 may be configured to reduce or increase the pressure of air output from gas source 316. Gas pressure regulator 306 may be configured to output of any suitable pressure, including, for example, more than about 5 psi, more than about 25 psi, more than about 50 psi, more than about 75 psi, less than about 125 psi, less than about 100 psi, less than about 80 psi, or less than about 60 psi.

Gas pressure regulator 306 may include an apparatus for controlling the flow of air. For example, a valve 376 may be connected to gas pressure regulator 306 to effectively serve as a switch for starting and stopping air flow. Valve may also be connected directly to gas source 316, without passing through gas pressure regulator 306. Valve 376 may be opened or closed depending on the desired amount of airflow. Thus valve 376 may be completely opened to achieve maximum air flow, adjusted to a partially closed state to decrease air flow, or closed altogether to stop air flow. Valve 376 may include any suitable valve, including, for example, a multi-position (e.g., two-position) solenoid valve. Gas source 316 may be configured to output a burst of air, of a sufficient pressure to deflect loop 16 to allow tape dispenser 100 to come substantially close to, or make contact with, lead foil 14. Gas source 316 may be configured to output air for a constant duration. Valve 376 may thus be used to start and stop the output of air flow through nozzle 210. Valve 376 may be opened for any suitable duration, including, for example, more than about 0.1 seconds, more than about 1 second, more than about 3 seconds, less than about 10 seconds, less than about 7 seconds, or less than about 5 seconds. For example, valve 376 may be opened and thus may permit air flow from gas source 316 for about 1 to about 1.5 seconds.

The opening of valve 376 may be triggered by the downward motion of tape dispenser 100. The horizontal motion of tape dispenser 100 during application of tape may cause valve 376 to close. The input and output signals may be processed using programmable logic circuitry (e.g., controller 326). Position sensors 336 may be placed within the head of tape dispenser 100 to determine whether tape dispenser 100 is moving on a vertical axis (i.e., being lowered) or on a horizontal axis (i.e., applying tape). Any suitable position sensor may be used, including any suitable commercially available magnetic proximity sensor, reed switch, Hall Effect sensor, mechanical limit switch, or optical sensor. For example, tape dispenser 100 may include an Omron E32-D21R fiber sensor. The position sensor may be connected to an amplifier, for example, an E3X-DA41S amplifier. System 50 may also include an adjustable valve in fluid connection with valve 376 for adjusting flow control. The adjustable valve may be manually adjusted through trial and error to find a suitable air flow setting. The adjustable valve may contain any suitable valve, including, for example, a needle valve.

System 50 may include a controller 326. Controller 326 may be configured to control various aspects of the operation of system 50. For example, controller 326 may output an OPEN or CLOSE signal to valve 376, causing valve 376 to go from a substantially closed position to a substantially open position, or vice versa (as well as any position in between). Valve 376 may be switched or adjusted manually (i.e., without controller 326). Controller 326 may also be configured to output a change pressure signal to gas pressure regulator 306. Gas pressure regulator 306, upon receiving the signal, may lower the pressure of air received from air pressure source 316. For example, controller 326 may output a HIGH or LOW signal to air pressure regulator 306, which can adjust the pressure of air output to valve 376. Controller 326 may be configured to alter the air pressure of a burst output to valve 376 as the position of tape dispenser 100 changes relative to loop 16. Controller 326 may use a timer to determine when to direct valve 376 to open or close. The timer may be located outside controller 326, or may be located entirely within controller 326.

Sensor 336 may also be configured to detect the presence of an obstruction-like loop 16 in the path of tape dispenser 100. Sensor 336 may be configured to alert controller 326 when loop 16 is in substantially close proximity to tape dispenser 100. Upon receiving indication from sensor 336, controller 326 can issue a STOP signal to halt the lowering of tape dispenser 100. The STOP signal can be output to a larger computer system or network, which may be configured to physically halt the lowering of tape dispenser 100, or the STOP signal can provide an alert for manufacturing facility operators to manually stop the lowering of the dispenser. Sensor 346 may be configured to search for and detect the presence of a loop 16 which covers the base portion of the conductive tape to be taped over before or after air pressure has been output to displace the loop. Sensor 336 may be connected directly to valve 376, and may output an OPEN or CLOSE signal to direct opening or closing of valve 376. The OPEN or CLOSE signal may alternatively be output to controller 326, which may effectively relay the OPEN or CLOSE signal to valve 376. Thus sensor 336, in conjunction with controller 326 and valve 376, may serve as a form of error detection to ensure that sufficient displacement of loop 16 was achieved with the air pressure output to allow lowering of tape dispenser 100 to proceed (i.e., via a START signal).

As noted above, various signals may be communicated by and among controller 326, gas pressure regulator 306, valve 376, and sensor 336, including, for example, any one of an OPEN, CLOSE, START, STOP, HIGH, or LOW signal. Any of the aforementioned signals may consist of any suitable signal to convey a respective intended action. For example, any of the OPEN, CLOSE, START, STOP, HIGH, or LOW signals may contain any suitable high or low signal, which any of controller 326, gas pressure regulator 306, or sensor 336 may interpret to respond with appropriate action. For example, an OPEN/START/HIGH signal may include a high voltage signal, for example, about 5 V; and a CLOSE/STOP/LOW signal may include a low voltage signal, for example, about −5 V. Alternatively, the OPEN/START/HIGH signal may include a low voltage signal, and the CLOSE/STOP/LOW signal may include a high voltage signal. The low and high voltage signals may correspond to any suitable voltage. For example, a low voltage signal may be less than about 10 V, less than about 5 V, less than about 0 V, less than about −5 V, or more than about −5 V. The high voltage signal may be more than about −5 V, more than about 0 V, more than about 5 V, or less than about 10 V. The aforementioned signals may include any suitable analog or digital.

The application of tape, consistent with the methods and systems discussed herein, onto a contact region of a photovoltaic module may facilitate fabrication of a connection assembly on the module. Photovoltaic modules having such a connection assembly may be incorporated into a system for generating electricity. For example, such a module may be illuminated with a beam of light to generate a photocurrent. The photocurrent may be collected and converted from direct current (DC) to alternating current (AC) and distributed to a power grid. Light of any suitable wavelength may be directed at the module to produce the photocurrent, including, for example, more than 400 nm, or less than 700 nm (e.g., ultraviolet light). Photocurrent generated from one photovoltaic module may be combined with photocurrent generated from other photovoltaic modules. For example, the photovoltaic modules may be part of a photovoltaic array, from which the aggregate current may be harnessed and distributed.

Although the inventions discussed herein are discussed in certain aspects with respect to the fabrication of a connection assembly of one or more photovoltaic modules, the inventions are not so limited. For example, the tape dispensing apparatuses and systems disclosed herein may be applicable for any occasion where applying tape to a surface is warranted, including, for example, construction use, home use, or the fabrication of any structures, materials, or devices.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method of applying a strip of tape, the method comprising:
    directing gas toward a raised section of a conductor positioned adjacent to a surface, wherein the conductor comprises a first base section at a first end of the raised section and secured adjacent to the surface, and a second base section at a second end of the raised section and secured adjacent to the surface, wherein the raised section intersects a vertical plane extending perpendicular from the first base section;
    displacing the raised section so that the raised section no longer intersects the vertical plane; and
    applying a strip of tape, starting at the first base section.

2. The method of claim 1, wherein the directing comprises directing a burst of gas toward a loop of a conductive tape strip adjacent to a contact region of a photovoltaic module.

3. The method of claim 1, wherein the gas comprises air.

4. The method of claim 1, wherein the gas comprises compressed air.

5. The method of claim 1, further comprising detecting the raised section and initiating gas flow upon detection of the raised section.

6. The method of claim 1, further comprising adjusting the directed gas.

7. The method of claim 1, further comprising stopping the directed gas.

8. The method of claim 1, further comprising initiating gas flow.

9. The method of claim 1, further comprising adjusting gas flow.

10. The method of claim 1, further comprising lowering a tape dispensing apparatus proximate to the surface.

11. The method of claim 10, further comprising detecting the raised section and stopping lowering of the tape dispensing apparatus.

12. The method of claim 11, wherein the directing occurs while the tape dispensing apparatus is in a stopped position.

* * * * *